United States Patent
Kinoshita et al.

(10) Patent No.: US 6,930,950 B2
(45) Date of Patent: Aug. 16, 2005

(54) SEMICONDUCTOR MEMORY DEVICE HAVING SELF-PRECHARGE FUNCTION

(75) Inventors: Mitsuya Kinoshita, Hyogo (JP); Hideyuki Noda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 73 days.

(21) Appl. No.: 10/706,964

(22) Filed: Nov. 14, 2003

(65) Prior Publication Data

US 2004/0233764 A1 Nov. 25, 2004

(30) Foreign Application Priority Data

Jan. 30, 2003 (JP) ........................................ 2003-022312

(51) Int. Cl.$^7$ ................................................. G11C 8/00
(52) U.S. Cl. ................... 365/230.03; 365/203; 365/205
(58) Field of Search ........................... 365/230.03, 203, 365/205, 189.01

(56) References Cited

U.S. PATENT DOCUMENTS 6,246,620 B1 * 6/2001 Fujioka et al. .............. 365/205

2001/0021140 A1 9/2001 Fujioka et al.

FOREIGN PATENT DOCUMENTS

| JP | P2000-207883 A | 7/2000 |
| JP | P2001-210077 A | 8/2001 |
| JP | P2002-15570 A | 1/2002 |

OTHER PUBLICATIONS

U.S. Appl. No. 10/325,827, Kinoshita.
U.S. Appl. No. 10/392,842, Taito.
U.S. Appl. No. 10/222,840, Fujino.

* cited by examiner

*Primary Examiner*—David Lam
(74) *Attorney, Agent, or Firm*—McDermott Will & Emery LLP

(57) ABSTRACT

An XOR gate receives an input from a pair of read data lines to output a self-precharge signal when there is an increased potential difference between the paired read data lines. Thus, immediately after the increased potential difference between the paired read data lines occurs upon issuance of a read command, a precharge operation is autonomically performed. Therefore, no external precharge command is necessary when the read command is issued and thus a higher-speed operation is easily achieved.

9 Claims, 17 Drawing Sheets

SEMICONDUCTOR MEMORY DEVICE HAVING SELF-PRECHARGE FUNCTION

BACKGROUND OF THE INVENTION

1. Field of the Invention

The present invention relates to semiconductor memory devices, and specifically to such a semiconductor memory device as a DRAM (Dynamic Random-Access Memory) performing a precharge operation.

2. Description of the Background Art

A conventional semiconductor memory device disclosed in Japanese Patent Laying-Open No. 2000-207883 has an additional external control signal line dedicated to the precharge operation. Then, regardless of commands, input of an external control signal from the external control signal line forces the precharge operation to be performed and thus the memory cycle time can be shortened.

The conventional semiconductor memory device, however, has a problem that a new external signal line as well as external control are required in order to effect the forced precharge operation by the input of the external control signal from the dedicated external control signal line.

SUMMARY OF THE INVENTION

One object of the present invention is to provide a semiconductor memory device achieving a higher speed of the memory operation without the need for a new external signal line and external control.

A semiconductor memory device according to the present invention includes: a plurality of memory blocks each including a plurality of memory cells arranged in rows and columns, a plurality of word lines respectively arranged correspondingly to a plurality of rows of the memory cells, and a plurality of pairs of bit lines respectively arranged correspondingly to a plurality of columns of the memory cells; a plurality of sense amplifier bands provided correspondingly to each of the memory blocks to sense and amplify data read from the memory cells; a plurality of pairs of read data lines extended commonly from the sense amplifier bands; and a logic circuit having input terminals connected to one pair of read data lines respectively of the pairs of read data lines. The logic circuit provides a self-precharge signal when an increased potential difference is generated between the pair of read data lines connected respectively to the input terminals.

According to the present invention, the memory operation can be increased in speed without the need for a new external signal line and external control.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
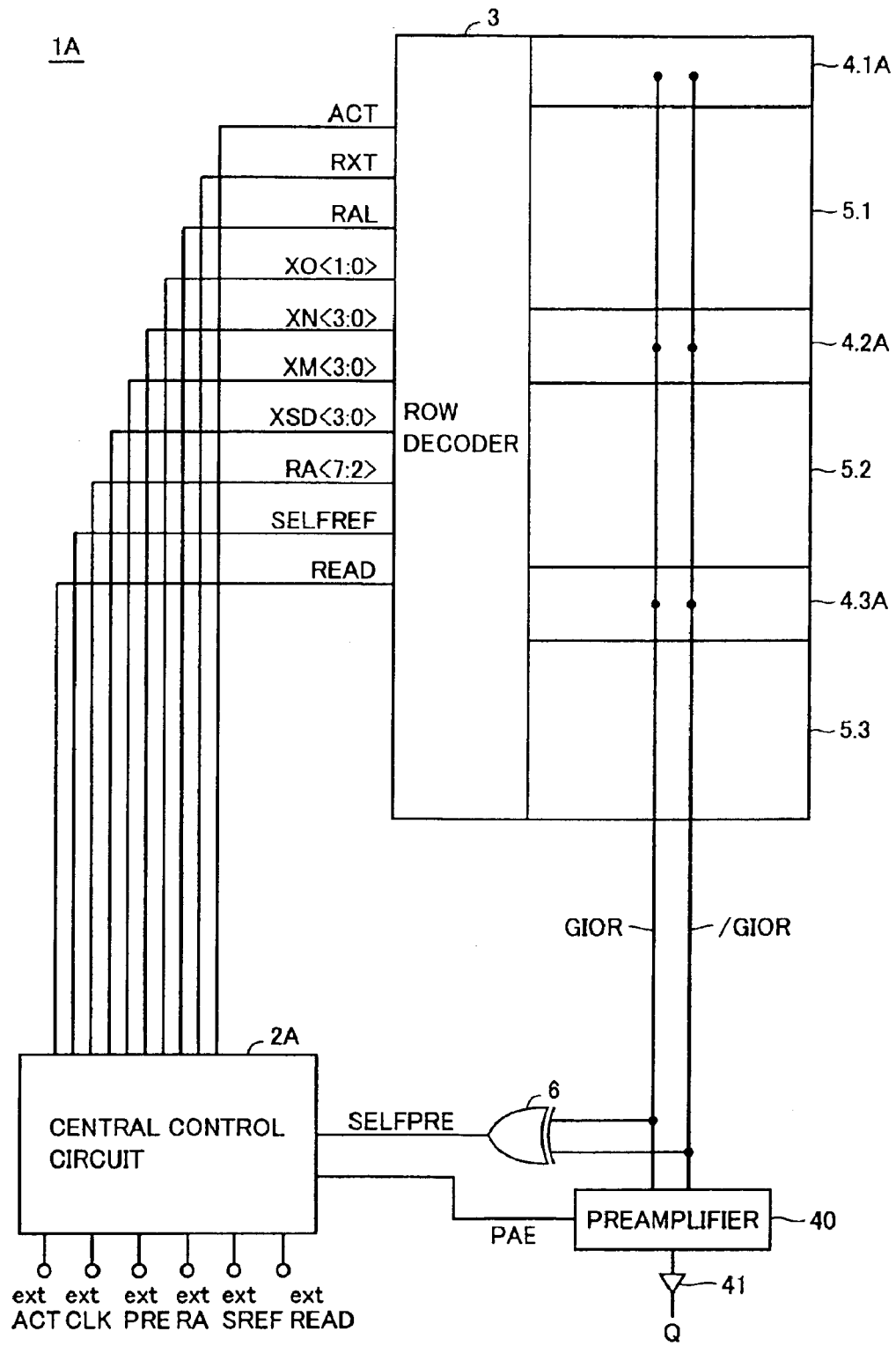
FIG. 1 is a schematic block diagram showing an entire configuration of a semiconductor memory device 1A according to a first embodiment of the present invention.

Embodiments of the present invention are hereinafter described in detail with reference to the drawings. It is noted that the same or corresponding components in the drawings are denoted by the same reference character and description thereof is not repeated.

First Embodiment

A semiconductor memory device 1A according to a first embodiment shown in FIG. 1 includes a central control circuit 2A, a row decoder 3, sense amplifier bands 4.1A, 4.2A, 4.3A, memory blocks 5.1, 5.2, 5.3, an XOR gate 6, a preamplifier 40, and a main amplifier 41.

Central control circuit 2A receives control signals extACT, extPRE, extSREF, extREAD indicative of commands, a clock signal extCLK and a row address signal extRA that are externally supplied thereto, to provide internal control signals ACT, RXT, RAL, SELFREF, READ, PAE and address signals XO<1:0>, XN<3:0>, XM<3:0>, XSD<3:0>, RA<7:2>to row decoder 3. A specific configuration of central control circuit 2A is detailed hereinlater.

Row decoder 3 receives these various signals supplied from central control circuit 2A to perform row-related decoding for sense amplifier bands 4.1A, 4.2A, 4.3A and memory blocks 5.1, 5.2, 5.3.

From sense amplifier bands 4.1A, 4.2A, 4.3A, a pair of read data lines GIOR and /GIOR common to sense amplifier bands 4.1A, 4.2A, 4.3A are extended to connect to the input terminals of XOR gate 6 and preamplifier 40 respectively. Although one pair of read data lines GIOR and /GIOR connected to XOR gate 6 and preamplifier 40 is representatively shown in FIG. 1, a plurality of pairs of read data lines are actually extended from sense amplifier bands 4.1A, 4.2A, 4.3A and one pair of read data lines GIOR and /GIOR of these pairs of read data lines is connected to the input terminals of XOR gate 6 and preamplifier 40 respectively.

XOR gate 6 outputs a self-precharge signal SELFPRE to central control circuit 2A when there arises an increased potential difference between paired data lines GIOR and /GIOR. Preamplifier 40 is connected to the pair of data lines GIOR and /GIOR. Preamplifier 40 receives data which is read onto the pair of read data lines GIOR and /GIOR to produce a single-ended output of the data in response to a preamplifier activation signal PAE. Main amplifier 41 buffers the data of the single-ended output from preamplifier 40 to output the data to a data output pin Q.

Figure 2:
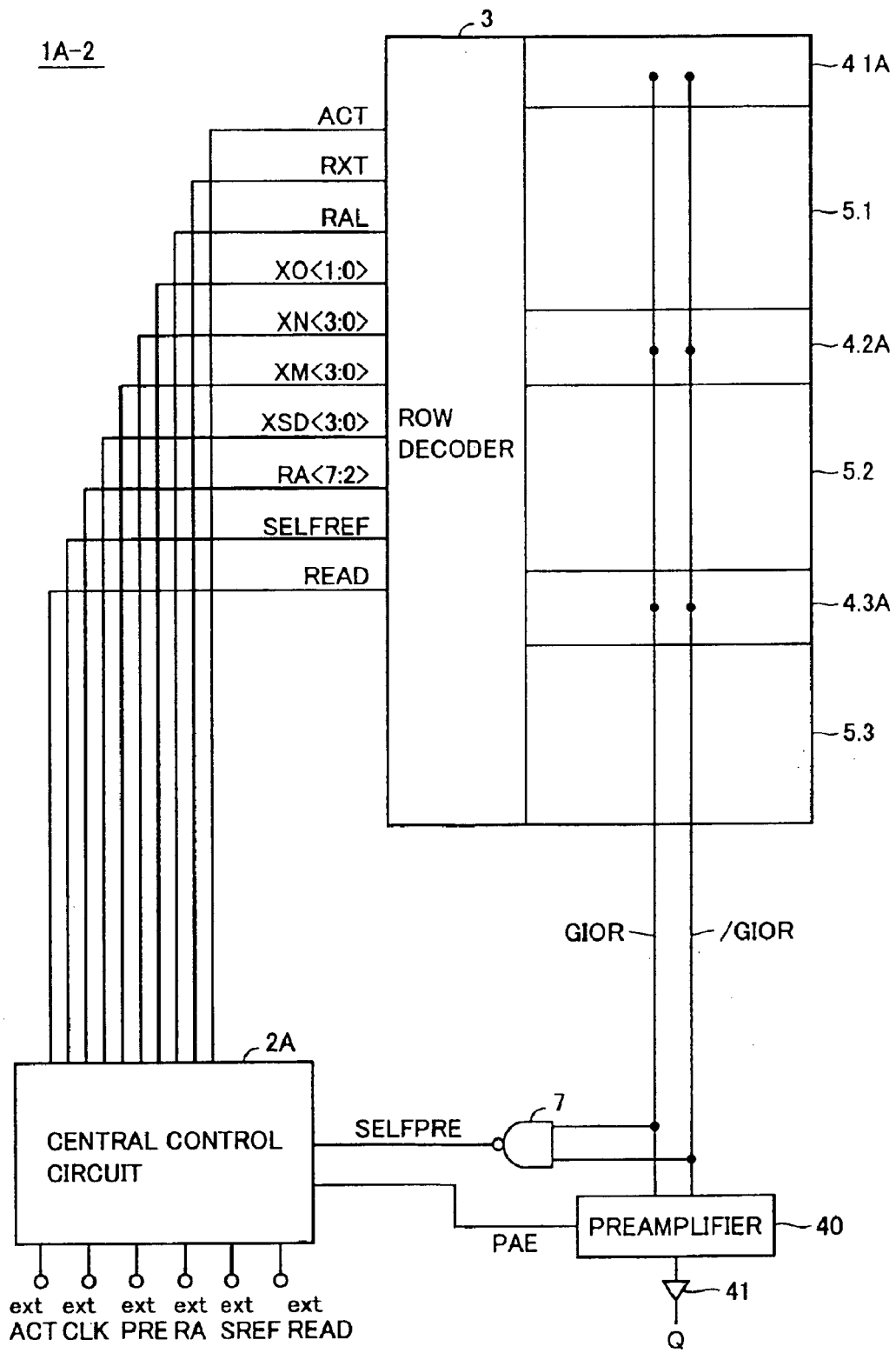
FIG. 2 is a schematic block diagram showing a modification of the entire configuration of semiconductor memory device 1A according to the first embodiment of the present invention.

FIG. 2 is a schematic block diagram showing a modification of the entire configuration of semiconductor memory device 1A according to the first embodiment of the present invention. A semiconductor memory device 1A-2 of the first embodiment that is shown in FIG. 2 differs from semiconductor memory device 1A in FIG. 1 in that XOR gate 6 is replaced by a NAND gate 7.

The XOR gate and NAND gate have only one difference therebetween that these gates produce different outputs respectively for an input (0,0). When paired read data lines GIOR and /GIOR are both precharged to a logical high level, i.e., H level, it never occurs in a normal operation that both of the paired read data lines GIOR and /GIOR have a logical low level, i.e., L level. For this reason, NAND gate 7 may be used instead of XOR gate 6 for generating self-precharge signal SELFPRE.

The NAND gate can generally be formed of a smaller number of transistors as compared with the XOR gate. Then, NAND gate 7 can be employed instead of XOR gate 6 to generate self-precharge signal SELFPRE with a smaller occupying area. Any XOR gate 6 of other embodiments may be replaced by NAND gate 7 as well.

Description is given below of a specific circuit configuration of a neighboring region, in sense amplifier band 4.2A as a representative of sense amplifier bands 4.1A, 4.2A, 4.3A, of paired read data lines GIOR and /GIOR connected respectively to the input terminals of XOR gate 6.

Figure 3:
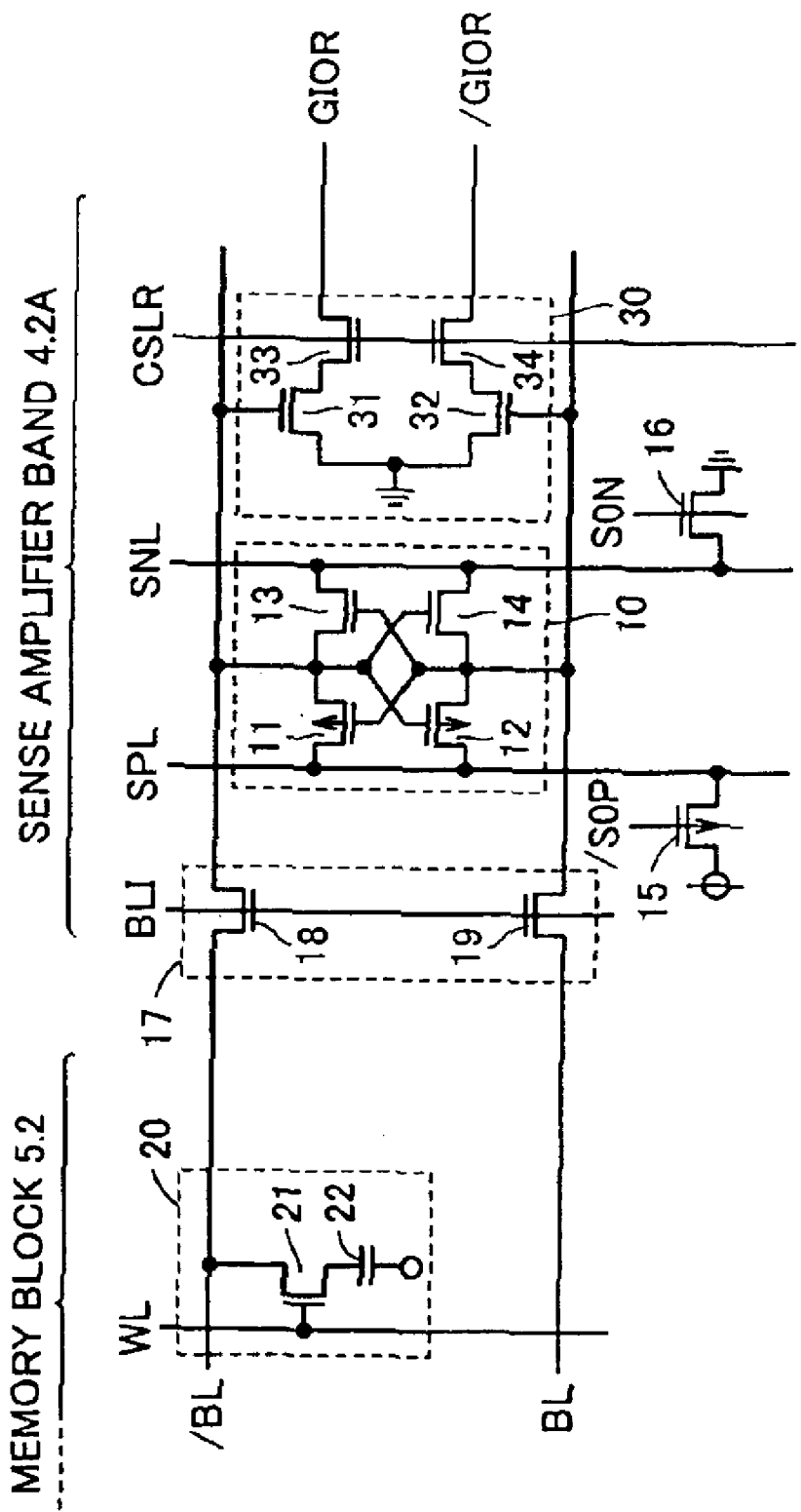
FIG. 3 is a circuit diagram partially showing a circuit configuration of a sense amplifier band 4.2A according to the first embodiment of the present invention.

FIG. 3 is a circuit diagram partially showing a circuit configuration of sense amplifier band 4.2A according to the first embodiment of the present invention.

As shown in FIG. 3, sense amplifier band 4.2A is adjacent to memory block 5.2 including a memory cell 20 and includes a sense amplifier 10, a P-channel MOS transistor 15, an N-channel MOS transistor 16, an isolation gate circuit 17, a read gate circuit 30.

Sense amplifier 10 is connected between paired bit lines BL and /BL and includes P-channel MOS transistors 11, 12 connected to a sense amplifier drive line SPL and N-channel MOS transistors 13, 14 connected to a sense amplifier drive line SNL.

Sense amplifier drive line SPL is driven to a power-supply potential VCC by a sense amplifier activation signal /SOP provided to P-channel MOS transistor 15. Sense amplifier drive line SNL is driven to a ground potential GND by a sense amplifier activation signal SON provided to N-channel MOS transistor 16.

Memory cell 20 in memory block 5.2 includes an N-channel MOS transistor 21 having its gate connected to a word line WL and its drain connected to bit line /BL and a capacitor having one terminal connected to the source of N-channel MOS transistor 21 and the other terminal fixed at a predetermined potential. This memory cell 20 is shown representatively as one of a plurality of memory cells included in memory block 5.2.

Isolation gate circuit 17 includes N-channel MOS transistors 18, 19 to electrically connect/disconnect circuitry on one side, with respect to the pair of bit lines BL and /BL, including memory block 5.2, and circuitry on the other side including sense amplifier band 4.2A, to/from each other, in response to a bit line isolation signal BLI.

Read gate circuit 30 is connected between paired bit lines BL and /BL. Read gate circuit 30 includes N-channel MOS transistors 31, 32 having respective gates connected to paired bit lines BL and /BL respectively and respective sources both connected to a ground node, and N-channel MOS transistors 33, 34 having respective sources connected to respective drains of N-channel MOS transistors 31, 32 and respective drains connected to paired read data lines GIOR and /GIOR respectively. N-channel MOS transistors 33, 34 are turned on/off in response to activation/inactivation of a column selection line CSLR.

Figure 4:
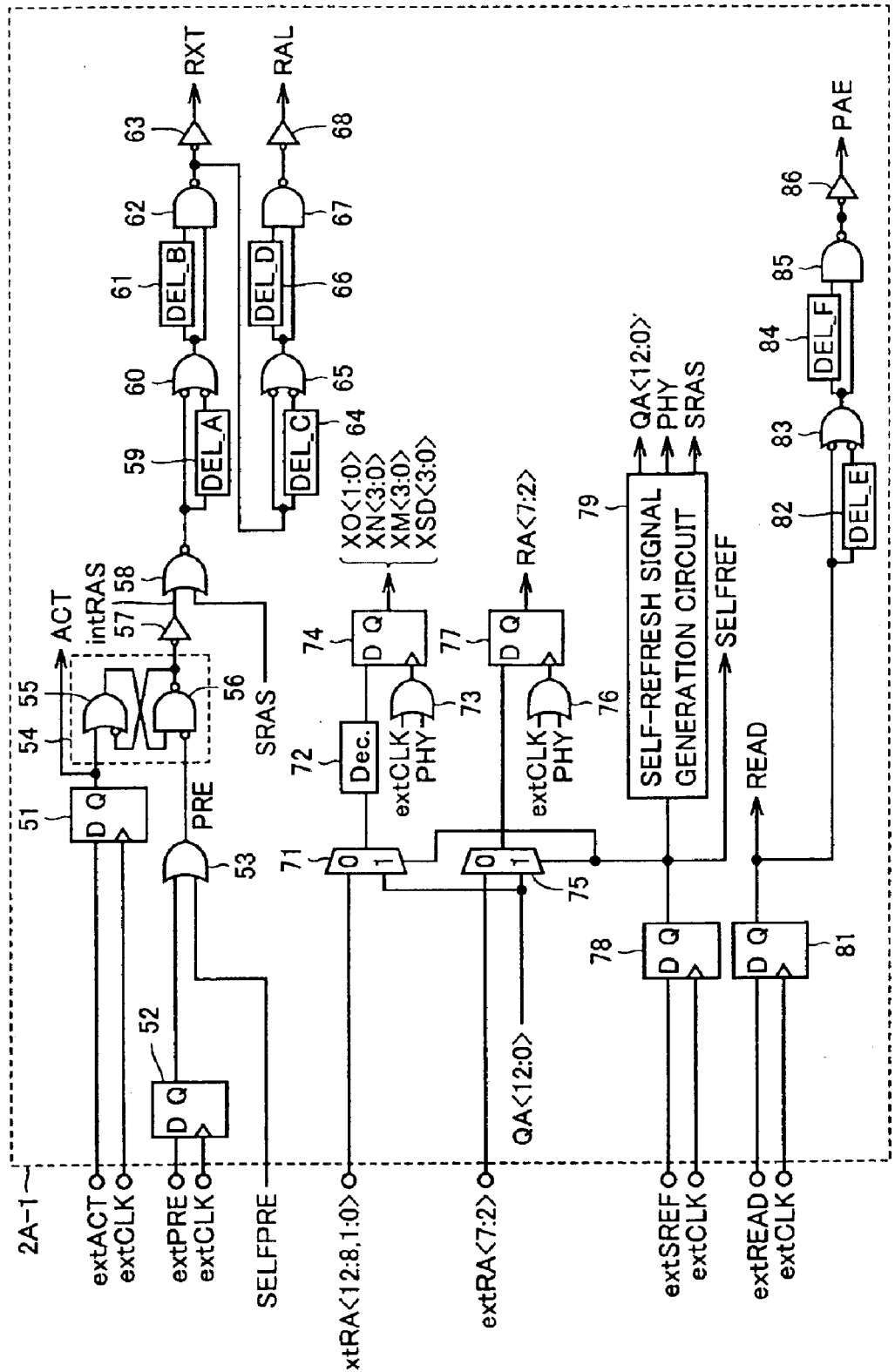
FIG. 4 is a circuit diagram showing a circuit configuration of a central control circuit 2A-1 according to the first embodiment of the present invention.

FIG. 4 is a circuit diagram showing a circuit configuration of a central control circuit 2A-1 according to the first embodiment of the present invention.

Referring to FIG. 4, central control circuit 2A-1 of the first embodiment includes a D flip-flop circuit 51 taking in control signal extACT at a rising edge of clock signal extCLK to output signal ACT, a D flip-flop circuit 52 taking in control signal extPRE at a rising edge of clock signal extCLK, an OR gate 53 receiving an output from D flip-flop circuit 52 and self-precharge signal SELFPRE generated from XOR gate 6 in FIG. 1 or NAND gate 7 in FIG. 2 to output a precharge signal PRE, a latch circuit 54 receiving signals ACT and PRE, and an inverter 57 receiving an output from latch circuit 54 to invert the output and provide a signal intRAS.

OR gate 53 outputs precharge signal PRE not only at a rising edge of the output from D flip-flop circuit 52 but also at a rising edge of self-precharge signal SELFPRE. Thus, a self-precharge operation can be performed without an externally-supplied precharge command by control signal extPRE.

Latch circuit 54 includes an OR gate 55 having one input receiving signal ACT and a NAND gate 56 receiving the inverted signal of signal PRE and an output from OR gate 55. An output from NAND gate 56 is inverted to be provided to the other input of OR gate 55 and to an input of inverter 57.

Central control circuit 2A-1 further includes a NOR gate 58 receiving signals intRAS and SRAS, a delay circuit 59 receiving and delaying an output from NOR gate 58, a NAND gate 60 receiving respective outputs from delay circuit 59 and NOR gate 58, a delay circuit 61 delaying an output from NAND gate 60, a NAND gate 62 receiving respective outputs from delay circuit 61 and NAND gate 60, and an inverter 63 receiving and inverting an output from NAND gate 62 to output signal RXT. Signal RXT is a trigger signal indicating an activation timing of the word line.

Central control circuit 2A-1 further includes a delay circuit 64 receiving and delaying the output from NAND gate 62, a NAND gate 65 receiving respective outputs from delay circuit 64 and NAND gate 62, a delay circuit 66 receiving and delaying an output from NAND gate 65, a NAND gate 67 receiving respective outputs from delay circuit 66 and NAND gate 65, and an inverter 68 receiving and inverting an output from NAND gate 67 to provide signal RAL. Signal RAL is a signal indicating a row-address latch timing.

Central control circuit 2A-1 further includes selectors 71 and 75. Selector 71 receives externally supplied row address signals extRA<12:8> and extRA<1:0> and a bit corresponding to address QA<12:0> at the time of refresh to output a refresh address when self-refresh signal SELFREF has H level and output an external row address signal when self-refresh signal SELFREF has L level.

Selector 75 receives externally supplied row address signal extRA<7:2> and a bit corresponding to address QA<12:0> at the time of refresh to output an address for self-refresh when self-refresh signal SELFREF has H level and output an external row address signal when self-refresh signal SELFREF has L level.

Central control circuit 2A-1 further includes a decode circuit 72 decoding the output from selector 71, an OR gate 73 receiving clock signals extCLK and PHY, a D flip-flop circuit 74 taking in an output from decode circuit 72 at a rising edge of an output from OR gate 73 to output decoded address signals XO<1:0>, XN<3:0>, XM<3:0>, and XSD<3:0>, an OR gate 76 receiving signals extCLK and PHY, and a D flip-flop circuit 77 taking in the output from selector 75 at a rising edge of an output from OR gate 76 to output row address signal RA<7:2>.

Moreover, central control circuit 2A-1 includes a D flip-flop circuit 78 taking in control signal extSREF at a rising edge of clock signal extCLK to output self-refresh signal SELFREF, and a self-refresh signal generation circuit 79 providing signal SRAS which is a row address strobe signal at the time of self-refresh in response to activation of self-refresh signal SELFREF, generating address signal QA<12:0> at the time of refresh and providing clock signal PHY.

Further, central control circuit 2A-1 includes a D flip-flop circuit 81 taking in control signal extREAD at a rising edge of clock signal extCLK to output signal READ, a delay circuit 82 receiving and delaying signal READ, a NAND gate 83 receiving an output from delay circuit 82 and signal READ, a delay circuit 84 receiving and delaying an output from NAND gate 83, a NAND gate 85 receiving respective outputs from delay circuit 84 and NAND gate 83, and an inverter 86 receiving and inverting an output from NAND gate 85 to output preamplifier activation signal PAE.

Figure 5:
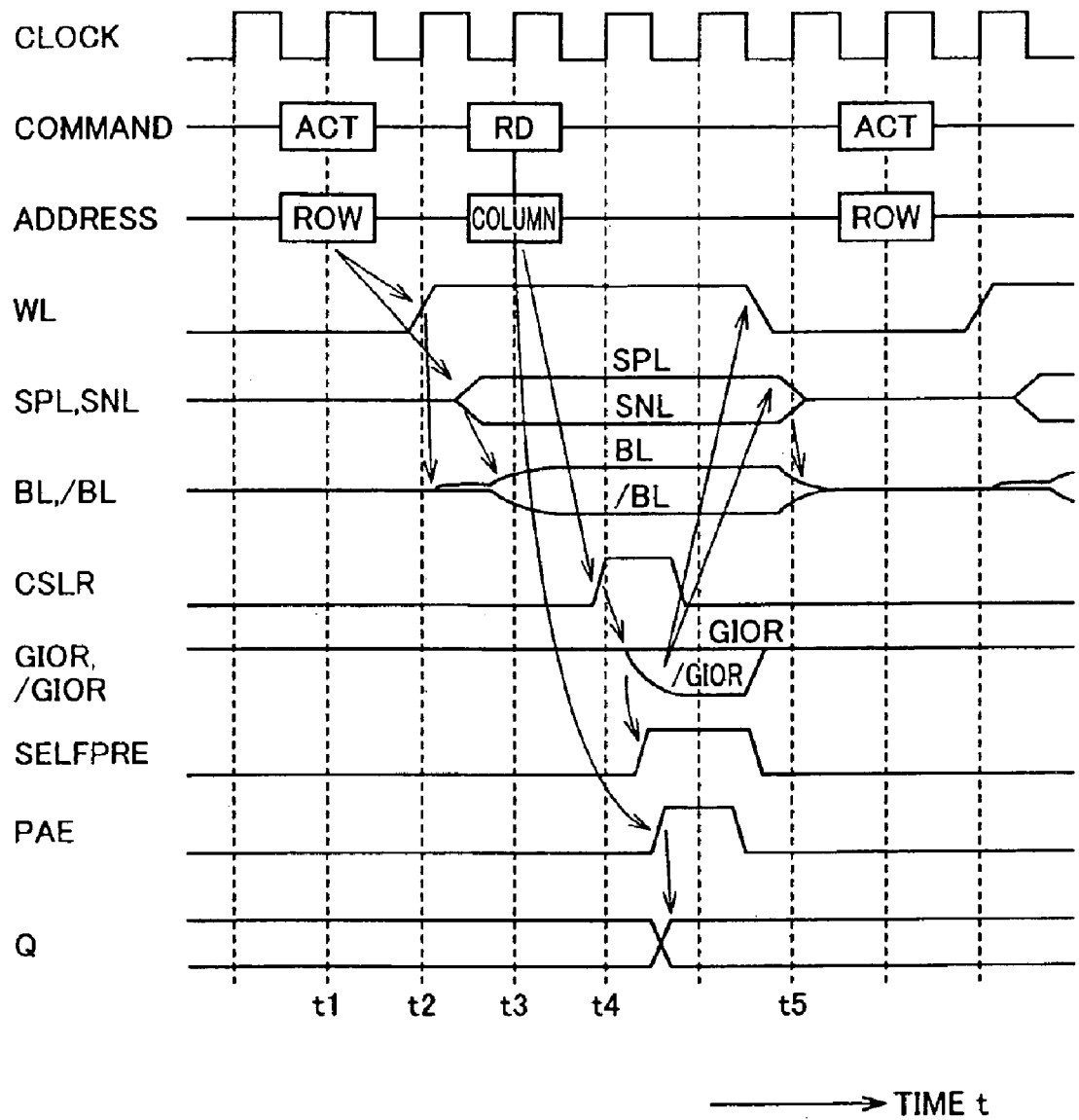
FIG. 5 is an operational waveform chart illustrating a circuit operation of sense amplifier band 4.2A controlled by central control circuit 2A-1.

FIG. 5 is an operational waveform chart illustrating a circuit operation of sense amplifier band 4.2A controlled by central control circuit 2A-1.

At time t1, ACT command (activate command) is issued and a row address is input.

Upon reception of the input row address, word line WL is activated at time t2. Activation of word line WL causes N-channel MOS transistor 21 in memory cell 20 to turn on thereby causing charges to flow from capacitor 22 to bit line /BL. Consequently, a slight potential difference is generated between paired bit lines BL and /BL that are equalized to VCCa/2 in advance. Here, VCCa represents an amplitude voltage in the memory cell array of the semiconductor memory device.

Upon the input of the row address, sense amplifier drive lines SPL and SNL that are both equalized to VCCa/2 in advance are driven respectively to power-supply potential VCC and ground potential GND. Accordingly, the slight potential difference between paired bit lines BL and /BL is amplified to a potential difference between power-supply potential VCC and ground potential GND.

At time t3, RD command (read command) is issued and a column address is input. Upon reception of the input column address, read column selection line CSLR is activated at time t4.

Read column selection line CSLR is thus activated to drive paired read data lines GIOR and /GIOR that are precharged in advance to H level (logical high level), to H level and L level respectively according to data read onto paired bit lines BL and /BL.

The increased potential difference between paired read data lines GIOR and /GIOR causes self-precharge signal SELFPRE to be generated through XOR gate 6 in FIG. 1 or NAND gate 7 in FIG. 2. Upon the generation of self-precharge signal SELFPRE, word line WL is inactivated and, at time t5, sense amplifier drive lines SPL and SNL are both equalized to VCCa/2. Then, paired bit lines BL and/BL are both equalized to VCCa/2.

Further, the input of the column address activates preamplifier activation signal PAE. Upon the activation of preamplifier activation signal PAE, the data output onto paired read data lines GIOR and /GIOR is output through preamplifier 40 and main amplifier 41 to data output pin Q.

Thus, when RD command is issued and immediately after the increase in potential difference arises between paired read data lines GIOR and /GIOR, a precharge operation is carried out autonomically. For this reason, the semiconductor memory device of the first embodiment eliminates the need for an external precharge command when RD command is issued and readily achieves a higher-speed operation.

Moreover, the timing of the precharge operation depends on such conditions under which the operating speed is generally changed, as variations in the process, the upper and lower limits of the voltage and high temperature/low temperature for example. Then, the timing is designed here more easily as compared with the case in which the precharge command with its timing fixed by an external command is issued.

In the discussion above, it is supposed that the self-precharge operation is performed in a read operation only and a precharge command is externally supplied in a write operation. However, the precharge operation can be performed in the write operation as well, by performing the write operation simultaneously with the read operation all the time. Then, in central control circuit 2A-1 in FIG. 4, D flip-flop circuit 52 and OR gate 53 may be eliminated and self-precharge signal SELFPRE may directly be supplied to latch circuit 54. An embodiment in this case is detailed later in connection with a second embodiment.

Figure 6:
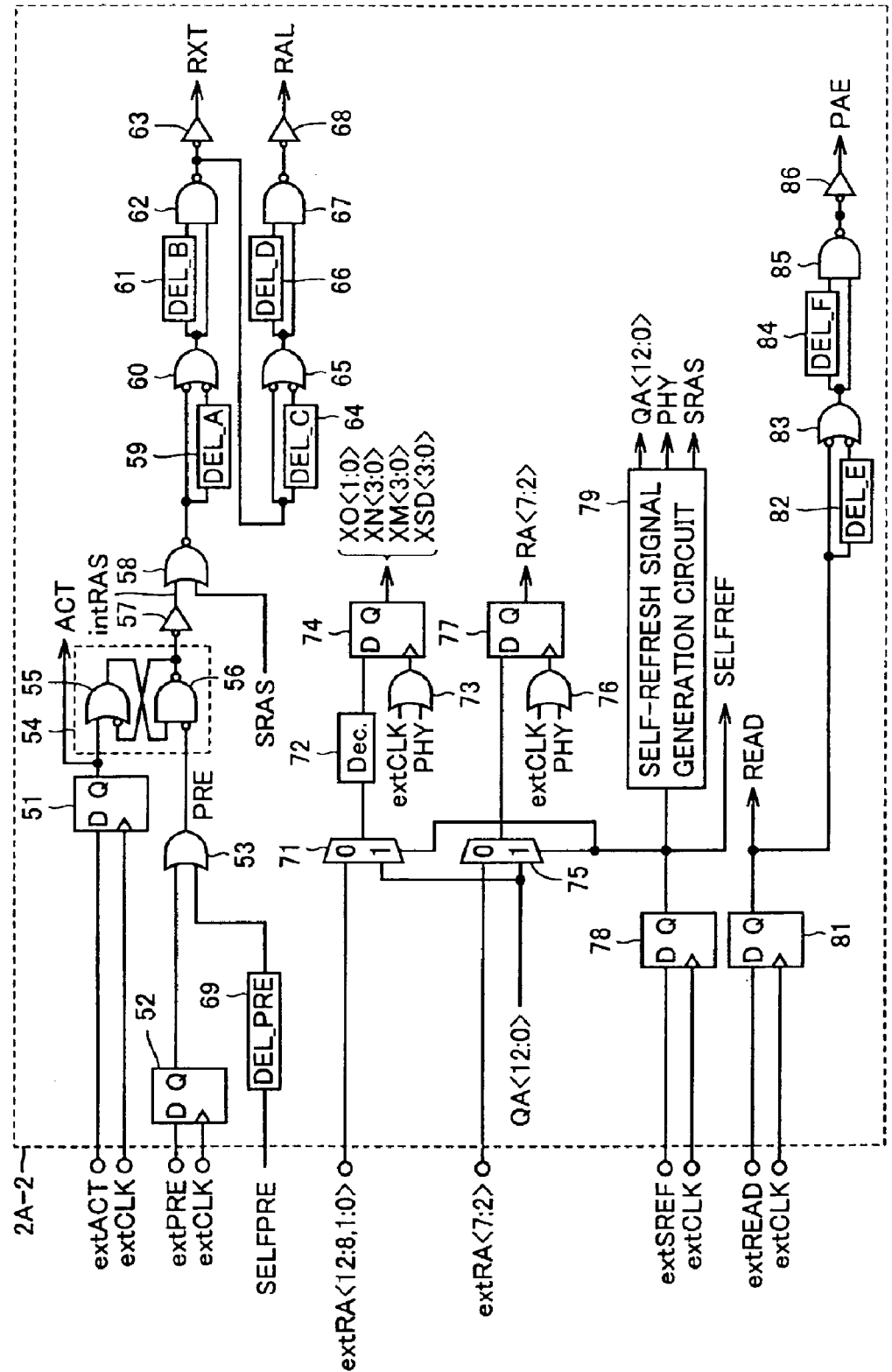
FIG. 6 is a circuit diagram showing a circuit configuration of a central control circuit 2A-2 according to the first embodiment of the present invention.

FIG. 6 is a circuit diagram showing a circuit configuration of a central control circuit 2A-2 according to the first embodiment of the present invention.

Central control circuit 2A-2 of the first embodiment shown in FIG. 6 differs from central control circuit 2A-1 in FIG. 4 in that a delay element 69 is inserted to precede the stage in which self-precharge signal SELFPRE is input to OR gate 53. Self-precharge signal SELFPRE can thus be delayed by delay element 69 and then input to OR gate 53 so as to improve the operation margin of the semiconductor memory device of the present invention and facilitate adjustment of the timing.

Figure 7:
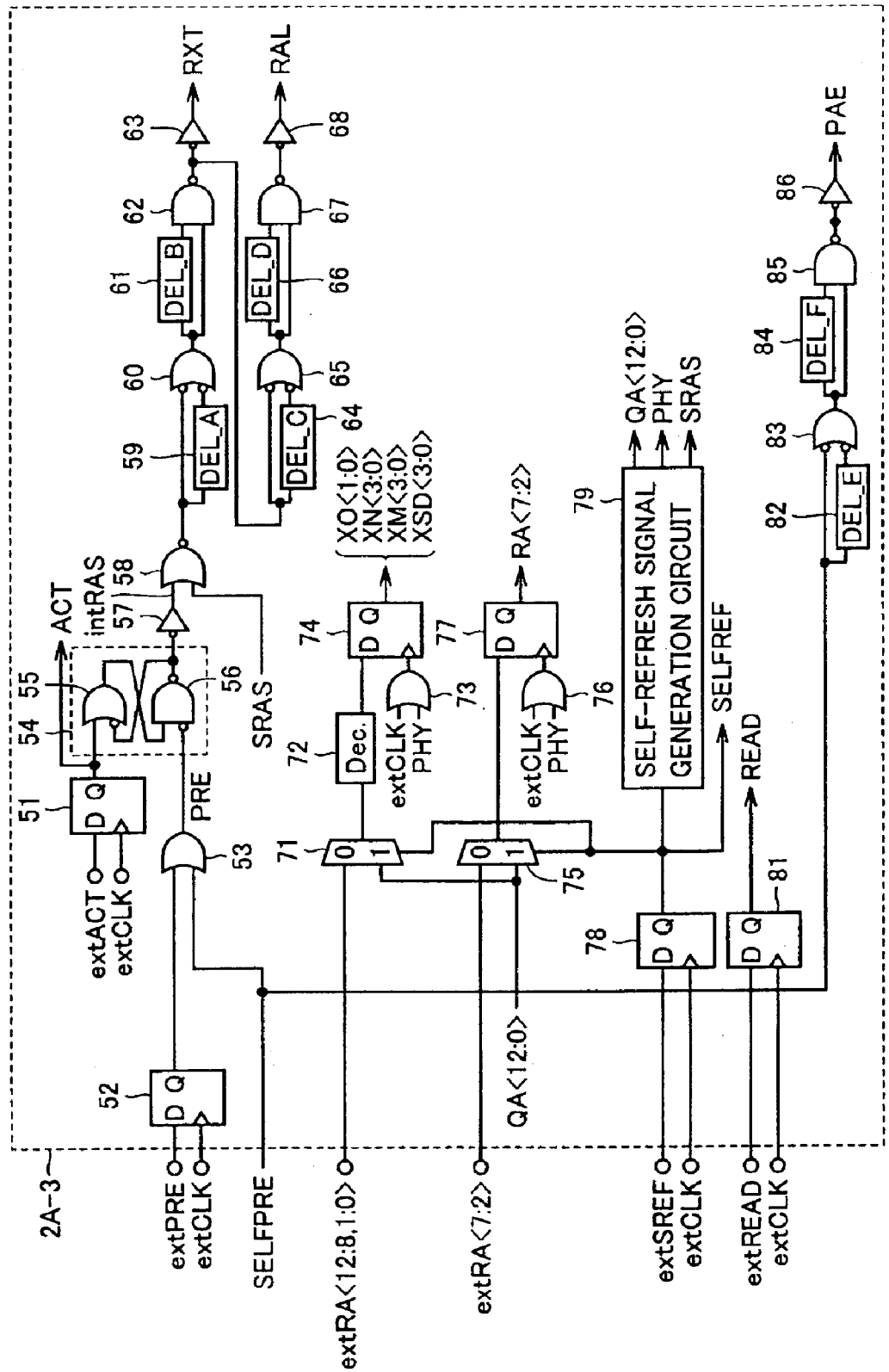
FIG. 7 is a circuit diagram showing a circuit configuration of a central control circuit 2A-3 according to the first embodiment of the present invention.

FIG. 7 is a circuit diagram showing a circuit configuration of a central control circuit 2A-3 according to the first embodiment of the present invention.

Central control circuit 2A-3 of the first embodiment shown in FIG. 7 differs from central control circuit 2A-1 in FIG. 4 in that self-precharge signal SELFPRE and its delay signal are input to NAND gate 83 instead of signal READ and its delay signal to generate the preamplifier activation signal PAE in the end.

Figure 8:
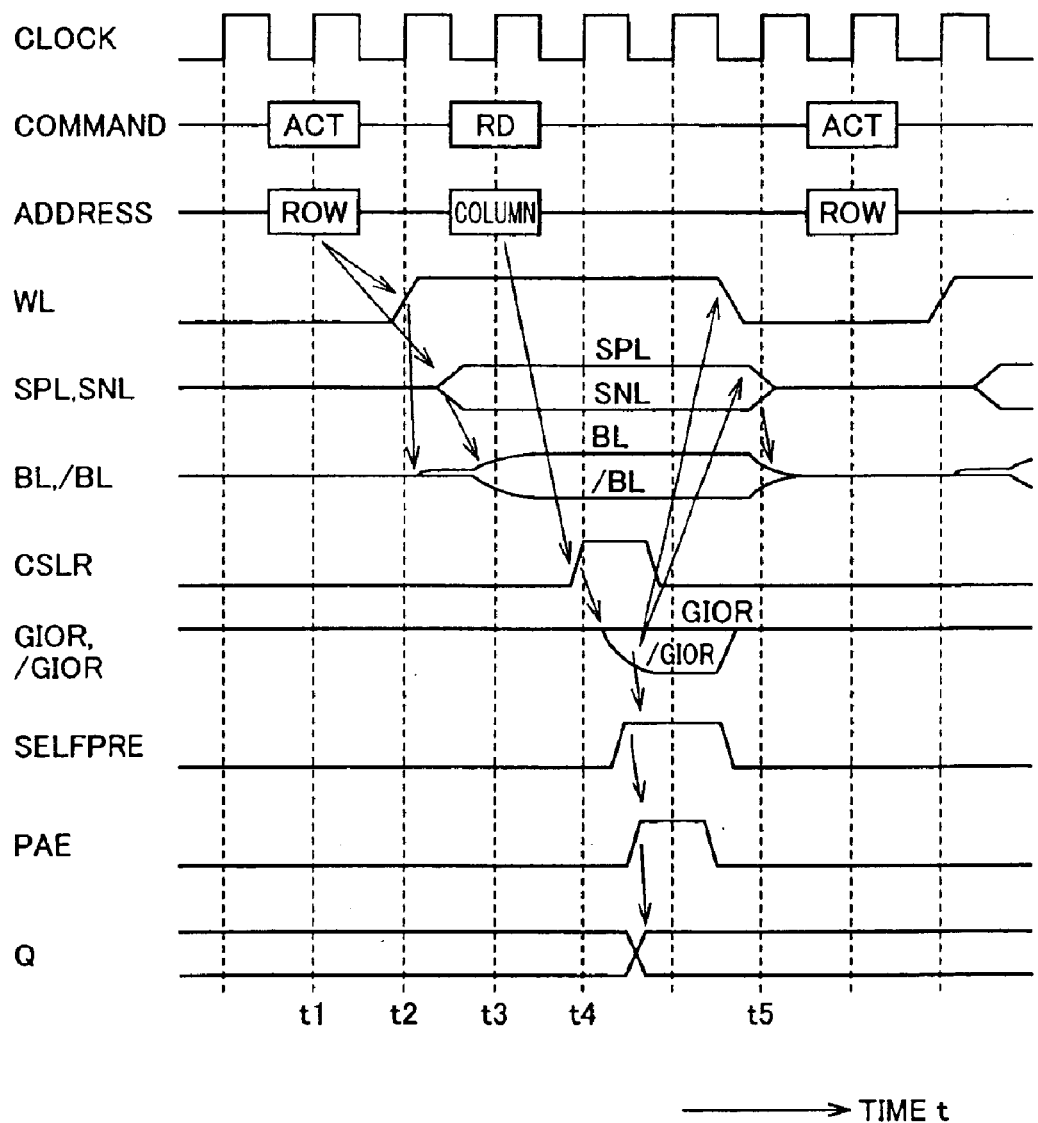
FIG. 8 is an operational waveform chart illustrating a circuit operation of sense amplifier band 4.2A controlled by central control circuit 2A-3.

FIG. 8 is an operational waveform chart illustrating a circuit operation of sense amplifier band 4.2A controlled by central control circuit 2A-3.

The operational waveform chart shown in FIG. 8 differs from the chart in FIG. 5 in that preamplifier activation signal PAE is activated not by the input of the column address but by generation of self-precharge signal SELFPRE.

Preamplifier activation signal PAE is thus activated upon generation of self-precharge signal SELFPRE, and accordingly the delay time up to activation of preamplifier activation signal PAE is shorter than that when preamplifier activation signal PAE is activated by the input of the column address. Further, as the activation of preamplifier activation signal PAE depends on the increase in potential difference between paired read data lines GIOR and /GIOR, design of the timing is facilitated.

As discussed above, according to the first embodiment, immediately after a potential difference between paired read data lines GIOR and /GIOR increases when RD commend is issued, the precharge operation is autonomically carried out, which eliminates the need for an externally supplied precharge command when RD commend is issued and achieves a higher-speed operation.

Second Embodiment

Figure 9:
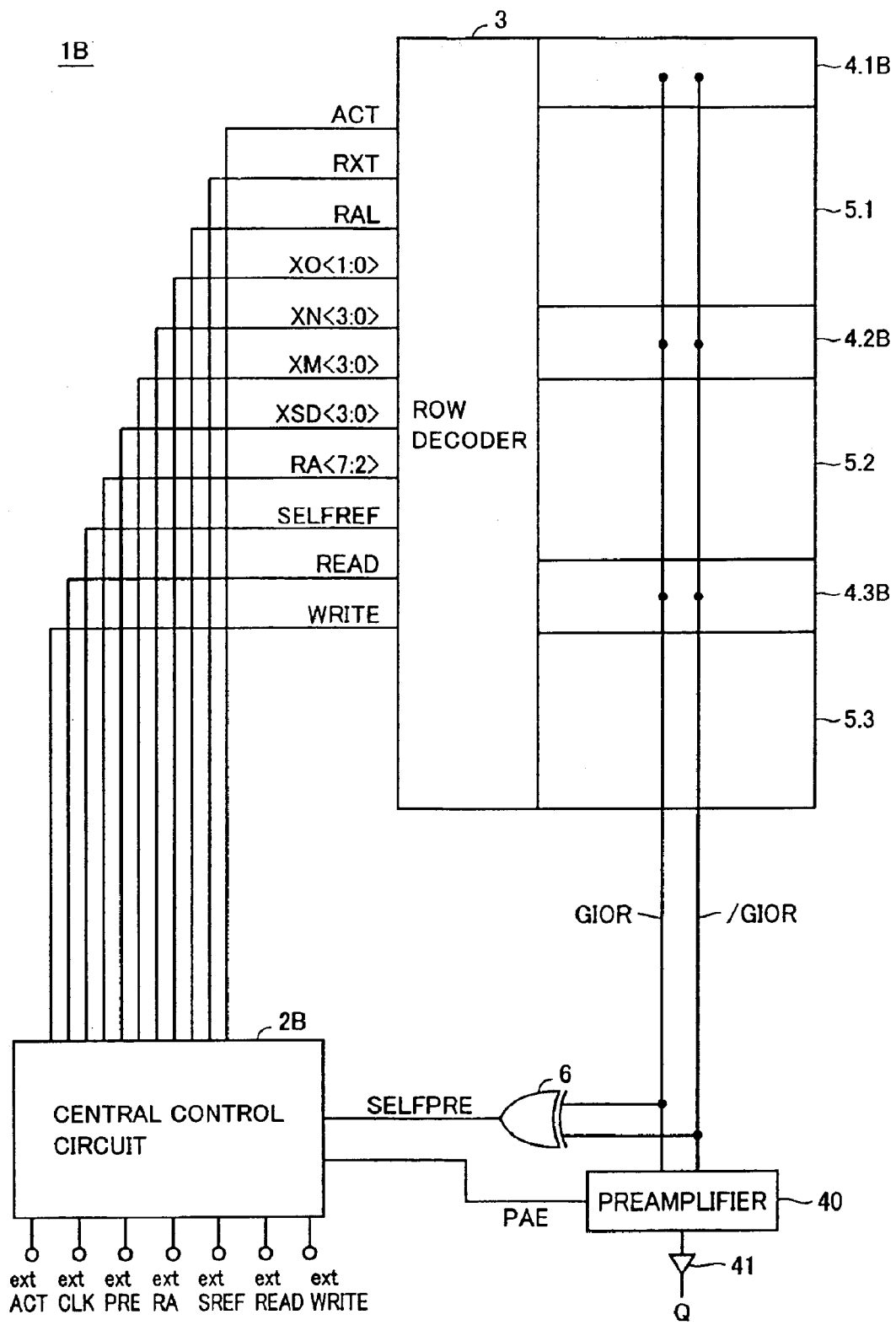
FIG. 9 is a schematic block diagram showing an entire configuration of a semiconductor memory device 1B according to a second embodiment of the present invention.

A semiconductor memory device 1B of a second embodiment shown in FIG. 9 includes a central control circuit 2B and sense amplifier bands 4.1B, 4.2B, 4.3B instead of central control circuit 2A and sense amplifier bands 4.1A, 4.2A, 4.3A. Specific configurations respectively of central control circuit 2B and sense amplifier band 4.2B as a representative of sense amplifier bands 4.1B, 4.2B, 4.3B are detailed hereinlater. It is noted that, as described in connection with FIG. 2 of the first embodiment, XOR gate 6 in FIG. 9 may be replaced by NAND gate 7.

Figure 10:
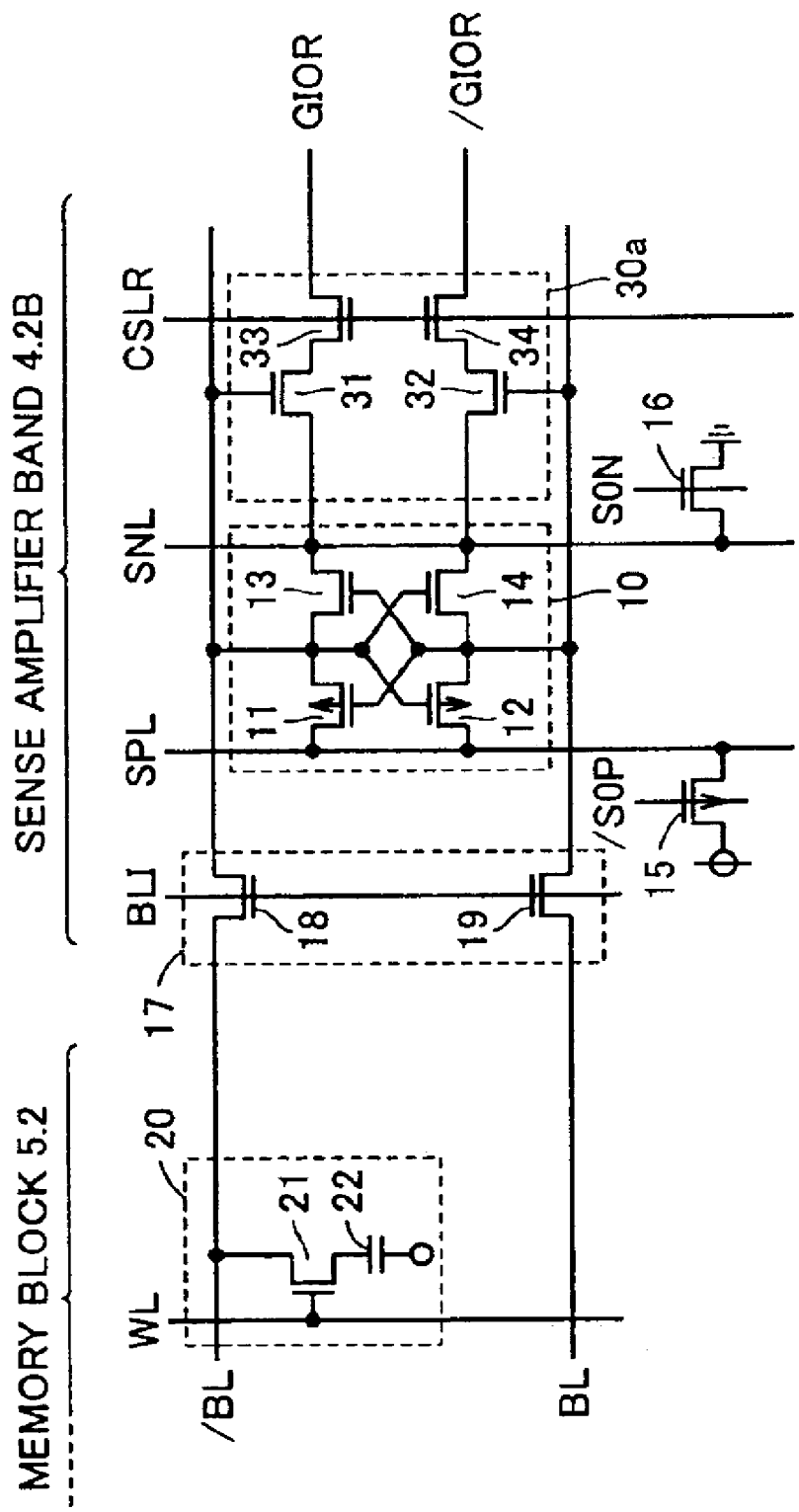
FIG. 10 is a circuit diagram partially showing a circuit configuration of a sense amplifier band 4.2B according to the second embodiment of the present invention.

FIG. 10 is a circuit diagram partially showing, a circuit configuration of sense amplifier band 4.2B according to the second embodiment of the present invention.

Sense amplifier band 4.2B of the second embodiment shown in FIG. 10 includes a read gate circuit 30a instead of read gate circuit 30 of sense amplifier band 4.2A shown in FIG. 2. Read gate circuit 30a differs from read gate circuit 30 in that respective sources of N-channel MOS transistors 31 and 32 are not connected to the ground node but to sense amplifier drive line SNL.

In sense amplifier band 4.2B of the second embodiment, as respective sources of N-channel MOS transistors 31 and 32 are connected to sense amplifier drive line SNL, N-channel MOS transistors 31 and 32 both stay in an OFF state until sense amplifier 10 is activated.

Then, even if read column selection line CSLR is selected before activation of sense amplifier 10, charges on the paired read data lines GIOR and /GIOR that have been precharged are never pulled down toward the ground since both of N-channel MOS transistors 31 and 32 are in the OFF state. Then, it never occurs that the inputs of the preamplifier both have L level, and normal data-reading can thus be accomplished.

Respective sources of N-channel MOS transistors 31 and 32 can be connected to sense amplifier drive line SNL to select read column selection line CSLR prior to activation of sense amplifier 10. Accordingly, it is achieved to eliminate the waiting time from the issuance of ACT command to the issuance of RD command that is required for the conventional semiconductor memory device.

The semiconductor memory device of the second embodiment can thus read data more speedily as compared with the conventional semiconductor memory device which activates the column selection line after waiting for sufficient amplification of a voltage difference between the bit lines upon activation of the sense amplifier. The same is applied similarly to high-speed writing of data.

A delay element is generally employed for adjusting the timing so as to activate the column selection line after sufficient amplification by the sense amplifier. The delay value of the delay element, however, could considerably vary depending on variations in the process as well as variations of the power-supply voltage and ambient temperature, for example. For the conventional semiconductor memory device, these variations must be included in the margin to adjust the timing, and this is one of factors of delay in the output of data.

On the other hand, the semiconductor memory device of the second embodiment requires no fine adjustment of the operation timing of the column selection line and therefore, the semiconductor memory device is hardly influenced by variations in the process and variations of the power-supply voltage and ambient temperature for example. Then, even under the conditions of the worst process variation, the minimum voltage and high temperature for example that generally result in operational delay of the semiconductor memory device, the degree of delay can be reduced as compared with that of the conventional semiconductor memory device.

Figure 11:
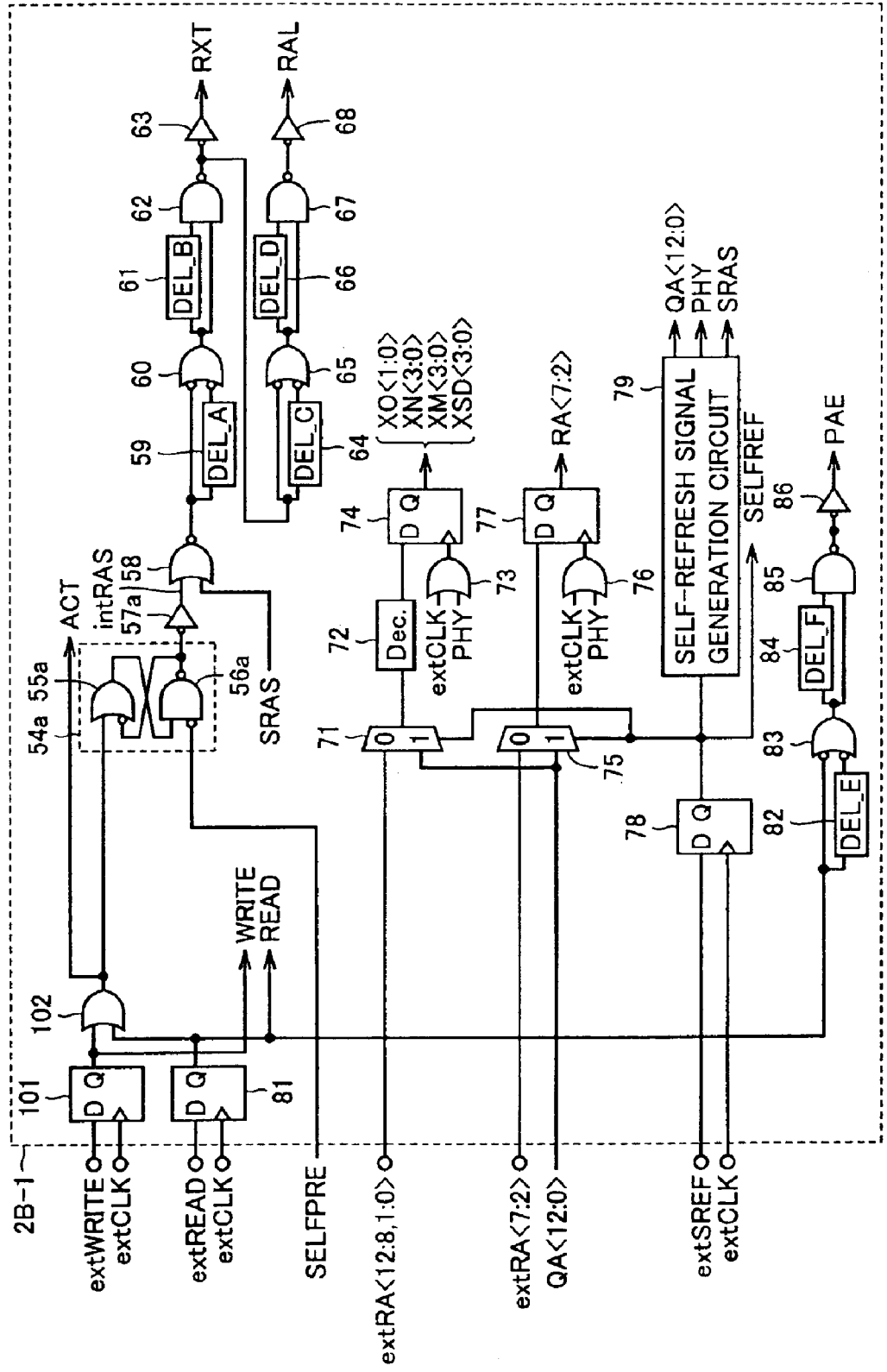
FIG. 11 is a circuit diagram showing a circuit configuration of a central control circuit 2B-1 according to the second embodiment of the present invention.

FIG. 11 is a circuit diagram showing a circuit configuration of a central control circuit 2B-1 according to the second embodiment of the present invention. Here, some differences between this central control circuit and central control circuit 2A-1 of the first embodiment shown in FIG. 4 are described.

Referring to FIG. 11, central control circuit 2B-1 includes a D flip-flop circuit 101 taking in control signal extWRITE at a rising edge of clock signal extCLK, an OR gate 102 receiving output signal WRITE from D flip-flop circuit 101 and output signal READ from D flip-flop circuit 81 to output signal ACT, a latch circuit 54a receiving signal ACT and self-precharge signal SELFPRE, and an inverter 57a receiving and inverting an output from latch circuit 54a to output signal intRAS.

OR gate 102 outputs signal ACT upon rising of signal WRITE or signal READ. Latch circuit 54a receives, at its one input, signal ACT which is thus generated and receives, at the other input, self-precharge signal SELFPRE which is directly provided to the input.

Latch circuit 54a includes an OR gate 55a having one input receiving signal ACT and a NAND gate 56a receiving the inverted signal of self-precharge signal SELFPRE and an output from OR gate 55a. An output from NAND gate 56a is inverted to be supplied to the other input of OR gate 55a and simultaneously supplied to the input of inverter 57a.

In this way, elimination of D flip-flop circuit 52 and OR gate 53 and supply of self-precharge signal SELFPRE directly to latch circuit 54 further facilitate design of the timing.

Figure 12:
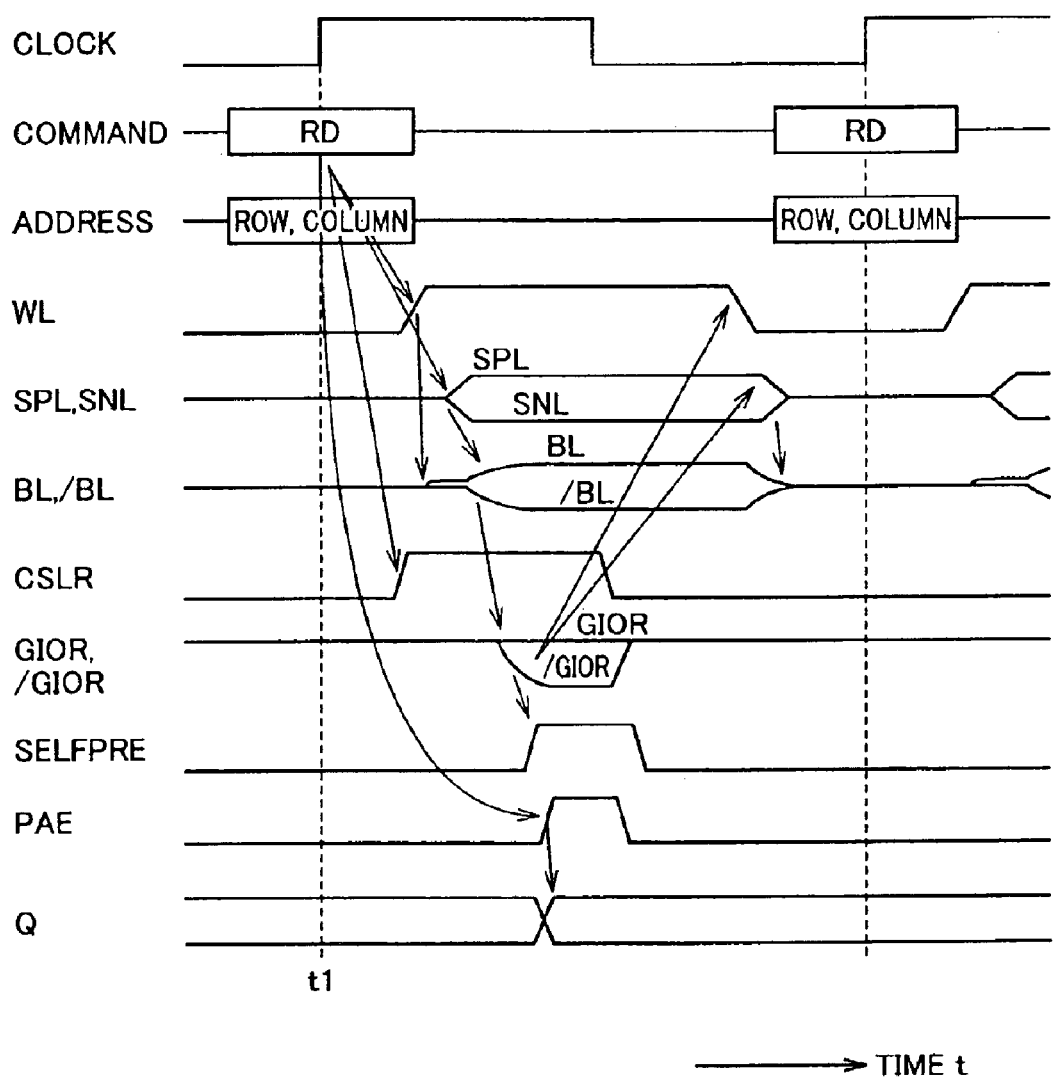
FIG. 12 is an operational waveform chart illustrating a circuit operation of sense amplifier band 4.2B controlled by central control circuit 2B-1.

FIG. 12 is an operational waveform chart illustrating a circuit operation of sense amplifier band 4.2B controlled by central control circuit 2B-1.

At time t1, RD command (read command) is issued and a row address and a column address are input simultaneously. It is supposed, for the second embodiment, that a read operation is always performed simultaneously with a write operation.

Upon the input of the row address, word line WL is activated. The activation of word line WL turns on N-channel MOS transistor 21 in memory cell 20 and, charges then flow from capacitor 22 to bit line /BL. Consequently, a slight potential difference occurs between paired bit lines BL and /BL that are both equalized to VCCa/2 in advance.

Upon the simultaneous input of the column address with the input of the row address, read column selection line CSLR is activated before activation of sense amplifier 10.

After the activation of read column selection line CSLR and upon the input of the row address, sense amplifier drive lines SPL and SNL that are both equalized to VCCa/2 in advance are driven respectively to power-supply potential VCC and ground potential GND. Accordingly, the slight potential difference between paired bit lines BL and /BL is amplified to a potential difference between power-supply potential VCC and ground potential GND.

As the slight potential difference between paired bit lines BL and /BL is amplified to a potential difference between power-supply potential VCC and ground potential GND, paired read data lines GIOR and /GIOR that are both precharged to H level (logical high) in advance and are complementary to each other are driven respectively to H level and L level according to data read onto paired bit lines BL and /BL.

The increased potential difference between paired read data lines GIOR and /GIOR causes generation of self-precharge signal SELFPRE through XOR gate 6 in FIG. 9 (or NAND gate 7). Upon generation of self-precharge signal SELFPRE, word line WL is inactivated and sense amplifier drive lines SPL and SNL are both equalized to VCCa/2. Then, paired bit lines BL and /BL are both equalized to VCCa/2.

Further, as the column address is input, preamplifier activation signal PAE is activated. Upon the activation of preamplifier activation signal PAE, the data output onto paired read data lines GIOR and /GIOR is output to data output pin Q through preamplifier 40 and main amplifier 41.

Thus, when RD command is issued and immediately after the increase in potential difference occurs between paired read data lines GIOR and /GIOR, a precharge operation is carried out autonomically. For this reason, the semiconductor memory device of the second embodiment eliminates the need for an external precharge command when RD command is issued and readily achieves a higher-speed operation.

The timing of the precharge operation depends on such conditions under which the operating speed is generally changed, as variations in the process, the upper and lower limits of the voltage and high temperature/low temperature for example. Further, self-precharge signal SELFPRE is input directly to latch circuit 54a. Then, the timing is designed here more easily as compared with the case in which the precharge command with its timing fixed by an external command is issued.

Figure 13:
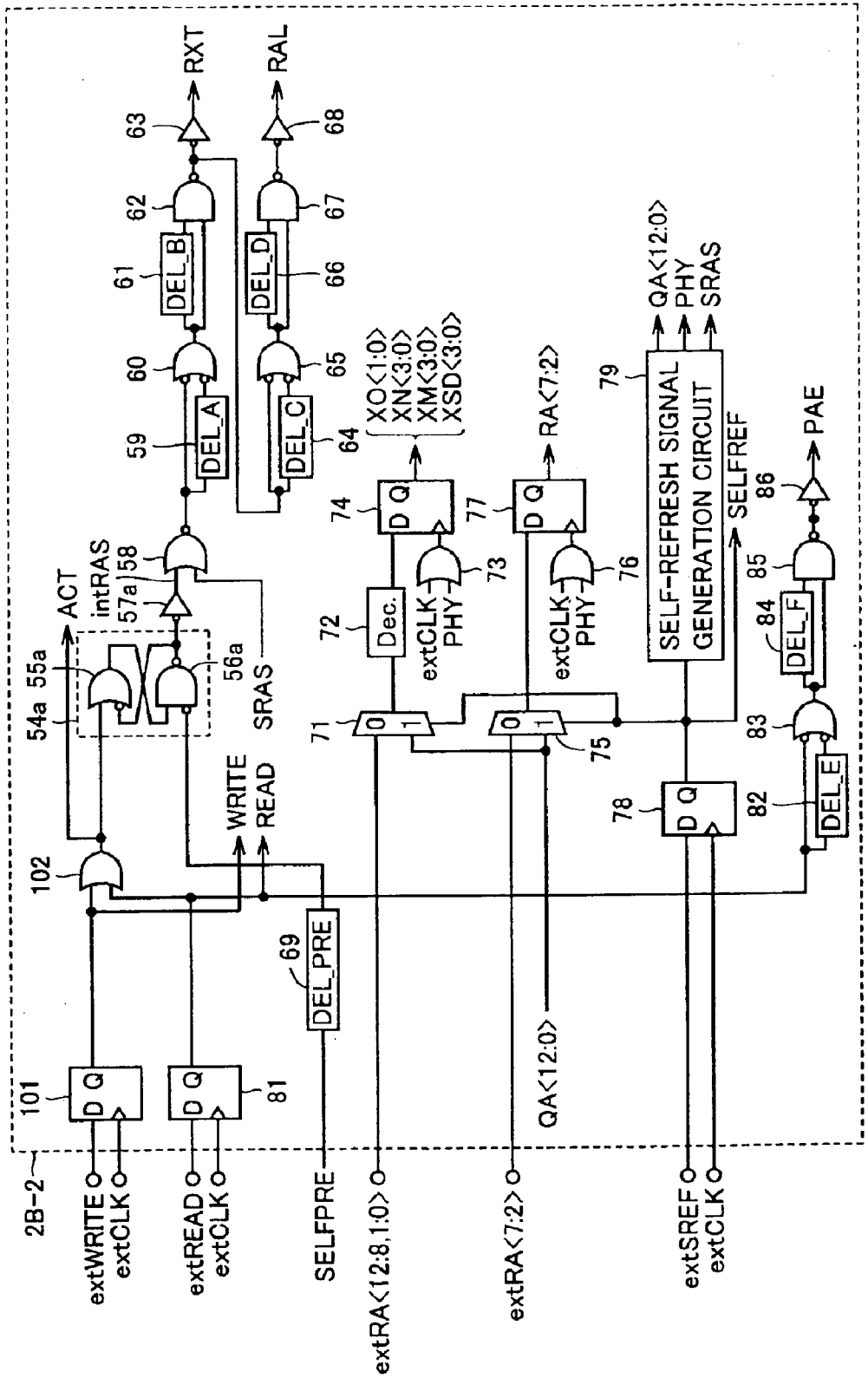
FIG. 13 is a circuit diagram showing a circuit configuration of a central control circuit 2B-2 according to the second embodiment of the present invention.

FIG. 13 is a circuit diagram showing a circuit configuration of a central control circuit 2B-2 according to the second embodiment of the present invention.

Central control circuit 2B-2 of the second embodiment shown in FIG. 13 differs from central control circuit 2B-1 in FIG. 11 in that a delay element 69 is inserted to precede the stage in which self-precharge signal SELFPRE is input to OR gate 102. Self-precharge signal SELFPRE can thus be delayed by delay element 69 and then input to OR gate 102 so as to further improve the operation margin of the semiconductor memory device of the present invention and facilitate adjustment of the timing.

Figure 14:
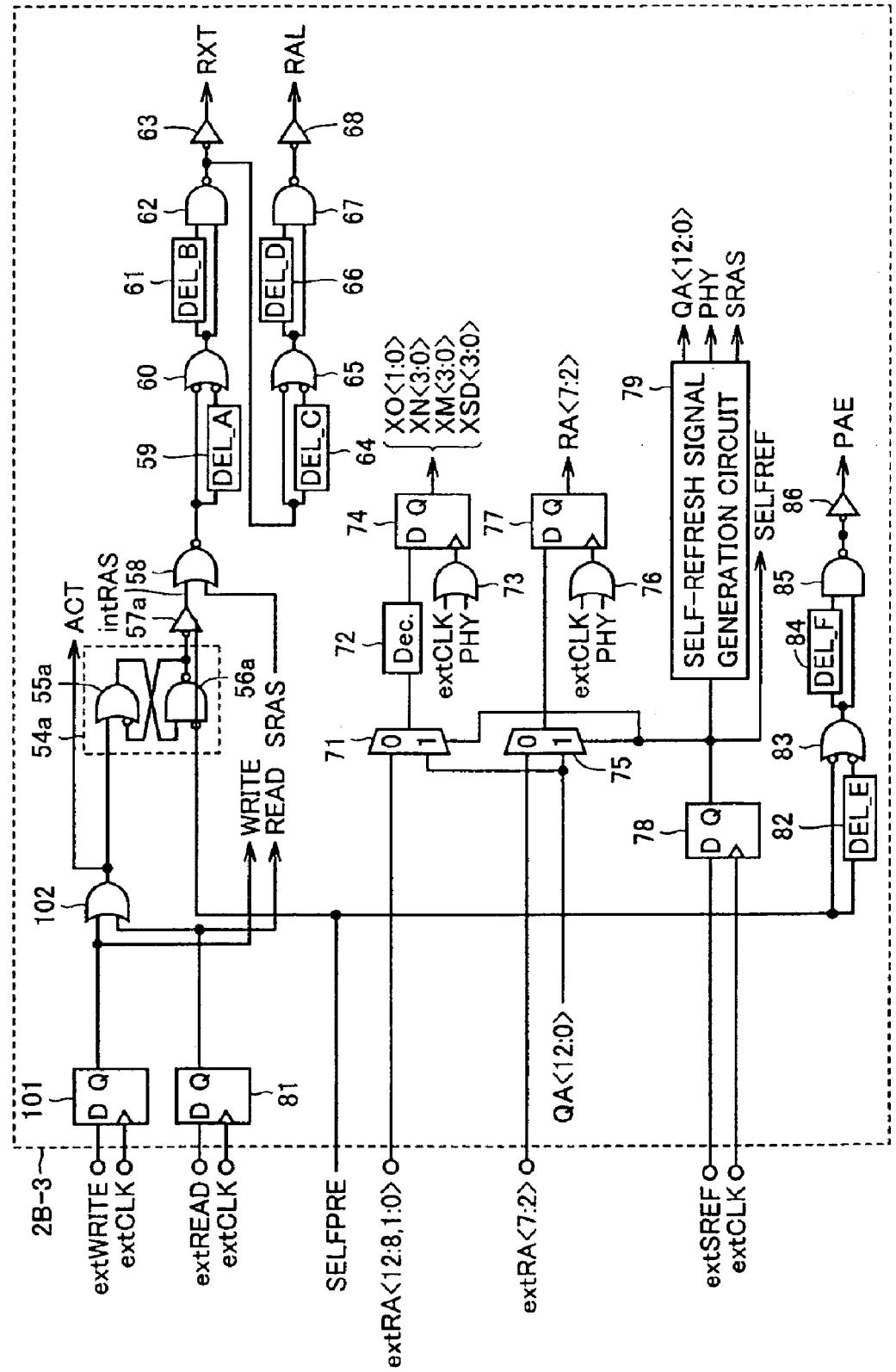
FIG. 14 is a circuit diagram showing a circuit configuration of a central control circuit 2B-3 according to the second embodiment of the present invention.

FIG. 14 is a circuit diagram showing a circuit configuration of a central control circuit 2B-3 according to the second embodiment of the present invention.

Central control circuit 2B-3 of the first embodiment shown in FIG. 14 differs from central control circuit 2B-1 in FIG. 11 in that self-precharge signal SELFPRE and its delay signal are input to NAND gate 83 instead of signal READ and its delay signal to generate the preamplifier activation signal in the end.

Figure 15:
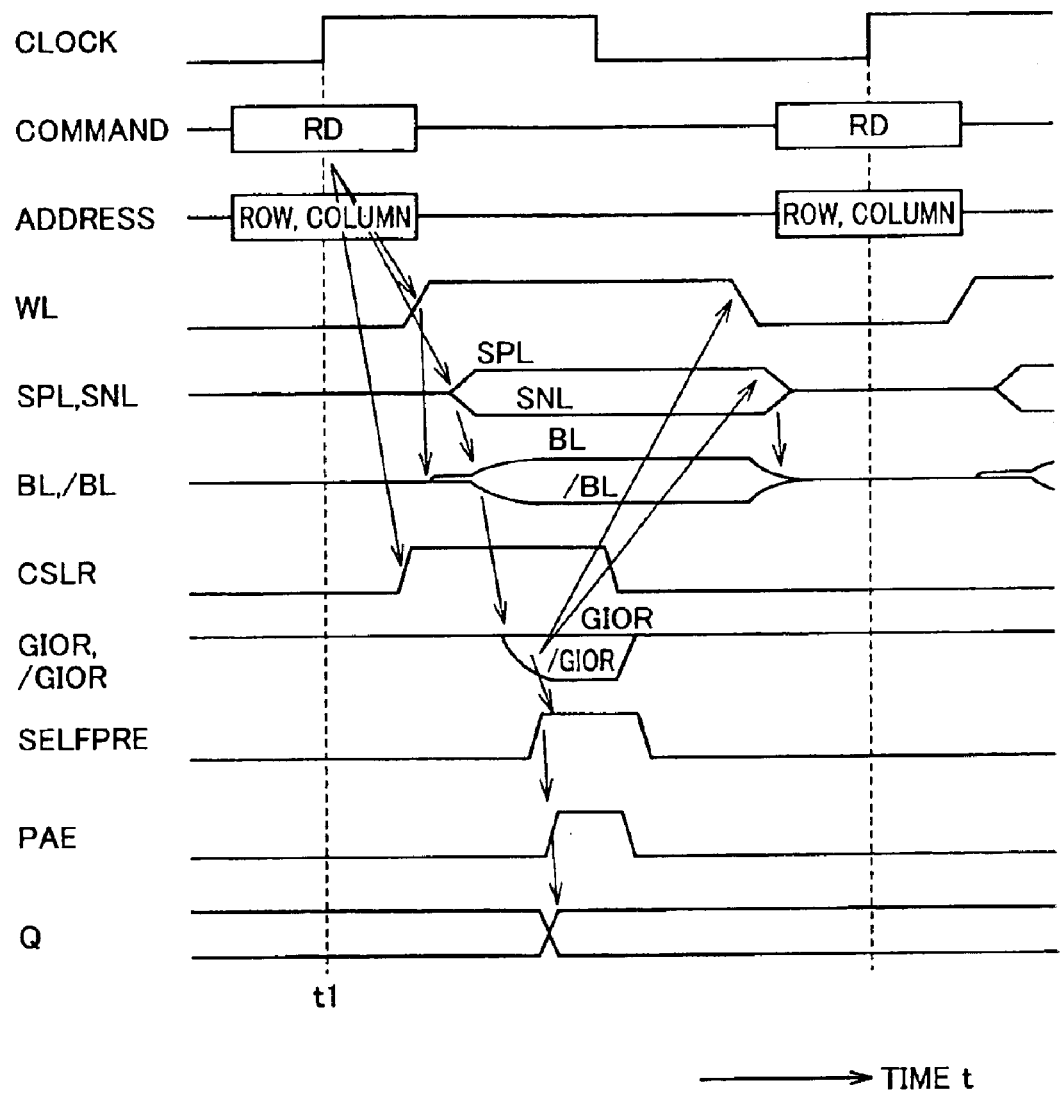
FIG. 15 is an operational waveform chart illustrating a circuit operation of sense amplifier band 4.2B controlled by central control circuit 2B-3.

FIG. 15 is an operational waveform chart illustrating a circuit operation of sense amplifier band 4.2B controlled by central control circuit 2B-3.

The operational waveform chart shown in FIG. 15 differs from the chart in FIG. 12 in that preamplifier activation signal PAE is activated not by the input of the column address but by generation of self-precharge signal SELFPRE.

Preamplifier activation signal PAE is thus activated upon generation of self-precharge signal SELFPRE, and accordingly the delay time up to activation of preamplifier activation signal PAE is shorter than that when preamplifier activation signal PAE is activated by the input of the column address. Further, as the activation of preamplifier activation signal PAE depends on the increase in potential difference between paired read data lines GIOR and /GIOR, design of the timing is facilitated.

As discussed above, the second embodiment achieves the effect of the first embodiment and further makes it possible to normally read data all the time while achieving a high-speed random access by connecting respective sources of N-channel MOS transistors 31 and 32 to sense amplifier drive line SNL.

Moreover, the direct input of self-precharge signal SELFPRE to latch circuit 54a further facilitates design of the timing.

Third Embodiment

Figure 16:
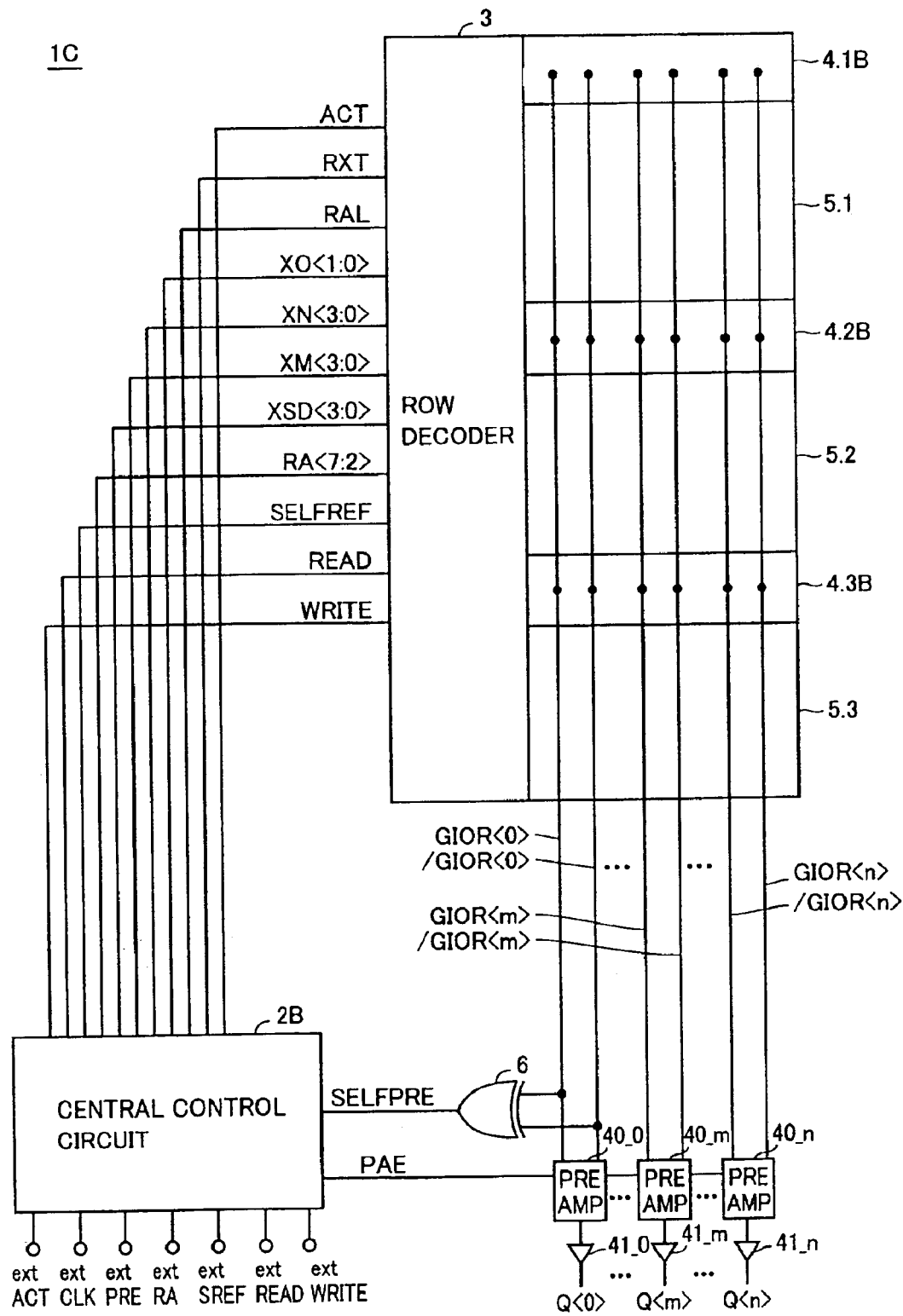
FIG. 16 is a schematic block diagram showing an entire configuration of a semiconductor memory device 1C according to a third embodiment of the present invention.

A semiconductor memory device 1C of a third embodiment shown in FIG. 16 is configured, as compared with the configuration of semiconductor memory device 1B of the second embodiment, to have a plurality of pairs of read data lines GIOR<m> and /GIOR<m> (m=1−n, n is a natural number) that are connected to preamplifier 40_m and one pair of read data lines GIOR<0> and /GIOR<0>, having the shortest distance (length) to the input terminals of XOR gate 6, connected to XOR gate 6.

Preamplifier 40_m receives data which is read onto the pair of read data lines GIOR<m> and /GIOR<m> to produce a single-ended output of the data in response to a preamplifier activation signal PAE. Main amplifier 41_m buffers the data of the single-ended output from preamplifier 40_m to output the data to a data output pin Q<m>. It is noted that the configuration of semiconductor memory device 1C of the third embodiment is applicable to semiconductor memory device 1A of the first embodiment.

In this way, the distance of the paired read data lines to the input terminals of XOR gate 6 can be shortened to allow the timing of self-precharge to occur earlier.

The distance of the pair of read data lines to the input terminals of XOR gate 6 is not necessarily the shortest. Instead, any pair of read data lines except for the pair of read data lines GIOR<n> and /GIOR<n> having the longest distance to the input terminals of XOR gate 6 may provide the same effect. Further, as described in connection with FIG. 2 of the first embodiment, XOR gate 6 may be replaced by NAND gate 7.

As discussed above, according to the third embodiment, the distance of the pair of read data lines to the input terminals of XOR gate 6 can be shortened to achieve a still higher operation of the semiconductor memory device.

Fourth Embodiment

Figure 17:
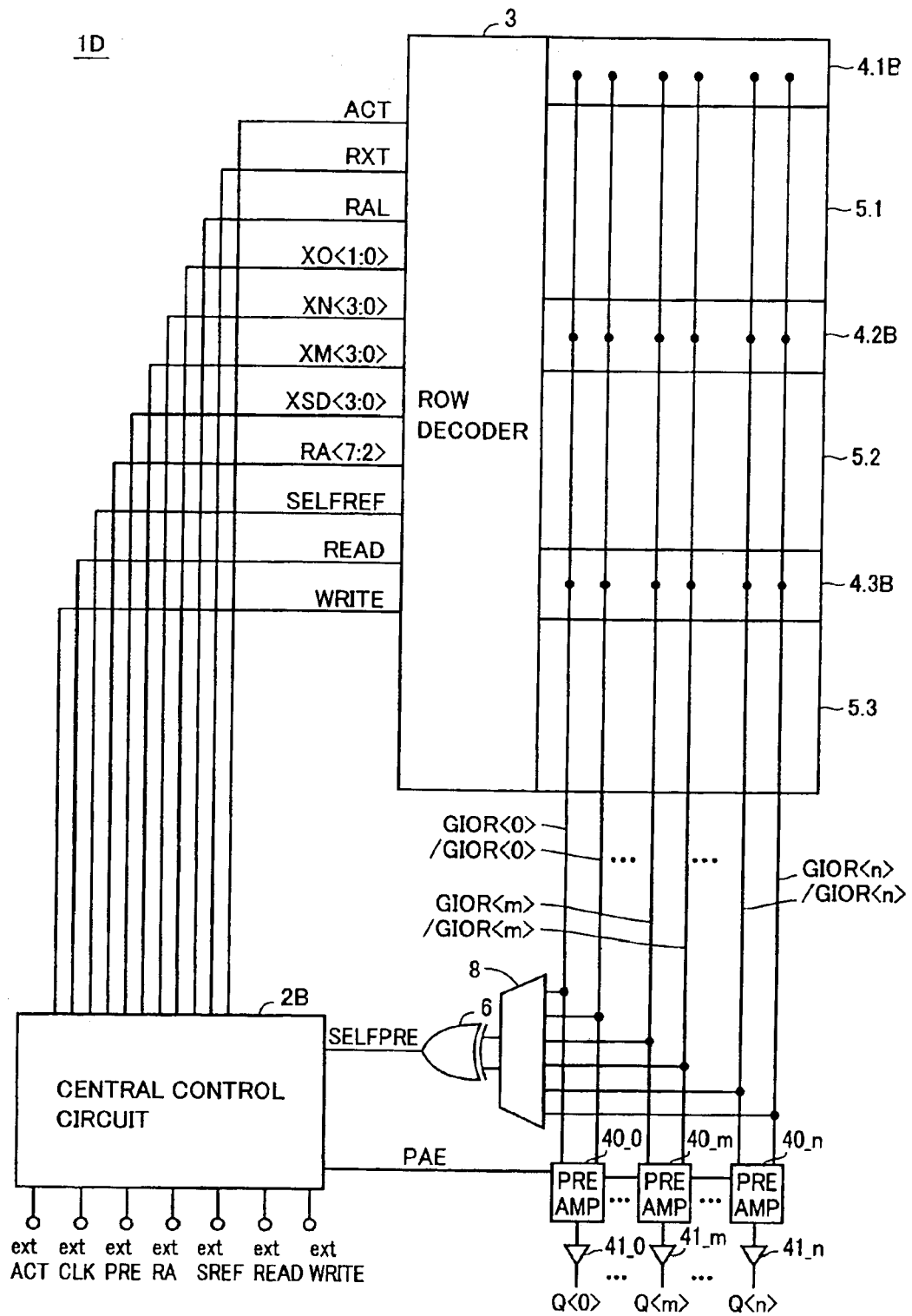
FIG. 17 is a schematic block diagram showing an entire configuration of a semiconductor memory device 1D according to a fourth embodiment of the present invention.

A semiconductor memory device 1D of a fourth embodiment shown in FIG. 17 is configured, as compared with the configuration of semiconductor memory device 1B of the second embodiment, to have a plurality of pairs of read data lines GIOR<m> and /GIOR<m> (m=1−n, n is a natural number) that are connected to preamplifier 40_m, and additionally include an IO selection circuit 8.

Preamplifier 40_m receives data which is read onto the pair of read data lines GIOR<m> and /GIOR<m> to produce a single-ended output of the data in response to a preamplifier activation signal PAE. Main amplifier 41_m buffers the data of the single-ended output from preamplifier 40_m to output the data to a data output pin Q<m>. The configuration of semiconductor memory device 1D of the fourth embodiment is applicable to semiconductor memory device 1A of the first embodiment as well.

IO selection circuit 8 receives inputs from a plurality of pairs of read data lines GIOR<m> and /GIOR<m> to select an arbitrary pair of read data lines therefrom and output data from the selected pair of read data lines to XOR gate 6. As selection means of IO selection circuit 8, mask switching means or any known programming means like fuse programming means, for example, may be employed.

In this way, an arbitrary one of the pairs of read data lines can be selected to set the timing for self-precharge in a more flexible manner and consequently, the operation of the semiconductor memory device is improved. As described in connection with FIG. 2 of the first embodiment, XOR gate 6 may be replaced by NAND gate 7.

As discussed above, according to the fourth embodiment, an arbitrary pair of read data lines can be selected from a plurality of pairs of read data lines to achieve, in addition to the effect of the third embodiment, improvement in the operation of the semiconductor memory device.

In the embodiments heretofore discussed, it is possible to allow read data to be read onto only the read input/output lines used for the self-precharge in a write operation as well and, to allow read data to be read onto read input/output lines not used for the self-precharge in a read operation only. Accordingly, the operation current in the write operation can be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory blocks each including a plurality of memory cells arranged in rows and columns, a plurality of word lines respectively arranged correspondingly to a plurality of rows of said plurality of memory cells, and a plurality of pairs of bit lines respectively arranged correspondingly to a plurality of columns of said plurality of memory cells;
   a plurality of sense amplifier bands provided correspondingly to each of said plurality of memory blocks to sense and amplify data read from said memory cells;
   a plurality of pairs of read data lines extended commonly from said plurality of sense amplifier bands; and
   a logic circuit having input terminals connected to one pair of read data lines respectively of said plurality of pairs of read data lines,
   said logic circuit providing a self-precharge signal when an increased potential difference is generated between the pair of read data lines connected respectively to the input terminals.

2. The semiconductor memory device according to claim 1, wherein
   said plurality of sense amplifier bands each include a read gate circuit provided correspondingly to each of said plurality of pairs of bit lines for reading data onto said pair of read data lines,
   said read gate circuit including
   a first transistor having its gate connected to one of said paired bit lines and its source dynamically changing according to activation/inactivation of said sense amplifier band, and
   a second transistor having its gate connected to the other of said paired bit lines and its source dynamically changing according to activation/inactivation of said sense amplifier band.

3. The semiconductor memory device according to claim 1, further comprising a central control circuit providing an internal precharge signal when receiving said self-precharge signal or an external precharge signal.

4. The semiconductor memory device according to claim 1, wherein
   said pair of read data lines connected respectively to the input terminals of said logic circuit is a pair of read data lines except for a pair of read data lines having the longest distance from one of said plurality of sense amplifier bands to the input terminals of said logic circuit.

5. The semiconductor memory device according to claim 4, wherein
   said pair of read data lines connected respectively to the input terminals of said logic circuit has the shortest distance from one of said plurality of sense amplifier bands to the input terminals of said logic circuit.

6. The semiconductor memory device according to claim 1, further comprising an input/output selection circuit selecting one pair of read data lines from said plurality of pairs of read data lines to connect the selected pair of read data lines respectively to the input terminals of said logic circuit.

7. The semiconductor memory device according to claim 1, wherein onto said pair of read data lines connected respectively to the input terminals of said logic circuit, among said plurality of pairs of read data lines, read data is allowed to be read in read operation and write operation and, onto any pair of read data lines except for said pair of read data lines connected respectively to the input terminals of said logic circuit, read data is allowed to be read in read operation only.

8. The semiconductor memory device according to claim 1, wherein
said logic circuit is an XOR circuit.

9. The semiconductor memory device according to claim 1, wherein
said logic circuit is a NAND circuit.

* * * * *